United States Patent
Visweswaran et al.

(10) Patent No.: US 9,716,248 B2
(45) Date of Patent: Jul. 25, 2017

(54) ORGANIC LIGHT-EMITTING DIODE DISPLAYS WITH REDUCED BORDER AREA

(71) Applicant: Apple Inc., Cupertino, CA (US)

(72) Inventors: Bhadrinarayana Lalgudi Visweswaran, Princeton, NJ (US); Zhen Zhang, San Jose, CA (US); Warren S. Rieutort-Louis, Cupertino, CA (US); Tsung-Ting Tsai, Taipei (TW)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/087,783

(22) Filed: Mar. 31, 2016

(65) Prior Publication Data

US 2017/0179432 A1 Jun. 22, 2017

(51) Int. Cl.
*H01L 51/54* (2006.01)
*H01L 27/32* (2006.01)
(Continued)

(52) U.S. Cl.
CPC ........ *H01L 51/5256* (2013.01); *H01L 27/323* (2013.01); *H01L 27/3211* (2013.01); *H01L 27/3246* (2013.01); *H01L 27/3258* (2013.01); *H01L 27/3262* (2013.01); *H01L 27/3276* (2013.01); *H01L 51/0097* (2013.01);
(Continued)

(58) Field of Classification Search
CPC ............. H01L 51/5256; H01L 27/3211; H01L 27/323; H01L 27/3246; H01L 27/3258; H01L 27/3262; H01L 27/3276; H01L 51/0097; H01L 51/5206; H01L 51/5234; H01L 51/5237; H01L 2251/5315; H01L 2251/5338
See application file for complete search history.

(56) References Cited

U.S. PATENT DOCUMENTS 8,592,832 B2 11/2013 Yang et al.
9,209,207 B2 12/2015 Park et al.
(Continued)

FOREIGN PATENT DOCUMENTS

EP 1646086 4/2006
EP 2259321 12/2010

OTHER PUBLICATIONS

Tao et al., U.S. Appl. No. 14/860,546, filed Sep. 21, 2015.

*Primary Examiner* — Karen Kusumakar
(74) *Attorney, Agent, or Firm* — Treyz Law Group, P.C.; Jason Tsai

(57) ABSTRACT

A display having thin-film transistor (TFT) structures may be used to display images within an active area of the display, which is surrounded by an inactive border area. In order to reduce the inactive area, a TFT passivation layer may be used to help protect conductive routing lines at the outer edge of the border so that encapsulation layers need not be formed all the way to the edge. At least some of the conductive routing lines in the inactive area may be stacked or coupled in parallel to help reduce border width. The TFT passivation layer may also cover the lateral edges of the routing lines to help prevent corrosion during an anode etch. The encapsulation layers may also be formed in a bent portion of the display substrate to help adjust the neutral stress plane such that metal traces formed in the bent portion do not crack.

15 Claims, 19 Drawing Sheets

(51) Int. Cl.
  *H01L 51/00* (2006.01)
  *H01L 51/52* (2006.01)
(52) U.S. Cl.
  CPC ...... *H01L 51/5206* (2013.01); *H01L 51/5234* (2013.01); *H01L 51/5237* (2013.01); *H01L 2251/5315* (2013.01); *H01L 2251/5338* (2013.01)

(56) References Cited

U.S. PATENT DOCUMENTS

| | | |
|---|---|---|
| 2002/0149572 A1 | 10/2002 | Schulz et al. |
| 2014/0042406 A1 | 2/2014 | Degner et al. |
| 2014/0055702 A1 | 2/2014 | Park et al. |
| 2014/0145155 A1 | 5/2014 | Park |
| 2014/0183473 A1 | 7/2014 | Lee et al. |
| 2014/0240985 A1 | 8/2014 | Kim et al. |
| 2014/0291641 A1 | 10/2014 | Megishi |
| 2014/0299884 A1 | 10/2014 | Park et al. |
| 2014/0353625 A1 | 12/2014 | Yi et al. |
| 2015/0004375 A1 | 1/2015 | Hou et al. |
| 2015/0069341 A1 | 3/2015 | Kim et al. |
| 2015/0102323 A1* | 4/2015 | Koshihara ........... H01L 27/3272 257/40 |
| 2015/0340648 A1 | 11/2015 | Jang |
| 2015/0380685 A1* | 12/2015 | Lee .................... H01L 51/5243 257/40 |
| 2015/0382446 A1 | 12/2015 | Kwon et al. |
| 2016/0066409 A1 | 3/2016 | Kwon et al. |
| 2016/0093685 A1 | 3/2016 | Kwon et al. |
| 2016/0095172 A1 | 3/2016 | Lee et al. |
| 2016/0260928 A1* | 9/2016 | Choi ................... H01L 51/5253 |

\* cited by examiner

ORGANIC LIGHT-EMITTING DIODE DISPLAYS WITH REDUCED BORDER AREA

This application claims the benefit of provisional patent application No. 62/269,792 filed on Dec. 18, 2015, which is hereby incorporated by reference herein in its entirety.

BACKGROUND

This relates generally to electronic devices with displays, and, more particularly, to organic light-emitting diode displays.

Electronic devices often include displays. Displays such as organic light-emitting diode displays have pixels with light-emitting diodes. The light emitting diodes each have electrodes (i.e., an anode and a cathode). Emissive material is interposed between the electrodes. During operation, current passes between the electrodes through the emissive material, generating light.

A display panel of an electronic device has an active display area that is surrounded by an inactive border region. Circuitry formed in the active area may be protected using encapsulation material. The encapsulation material can help prevent moisture from seeping into the active area of the display. When encapsulation material is used in forming a display, one or more dam structures have to be formed in the inactive border area to contain the encapsulation material. Formation of the dam structures can, however, increase the inactive border area.

Displays such as organic light-emitting diode displays may be formed on flexible substrates. Displays with flexible substrates may be bent. For example, it may be desirable to bend an edge of a display to hide inactive display components along the edge of the display from view. The process of bending a display can create stresses within the structures of the display. For example, bent metal traces may become stressed. Stress-induced damage such as cracks may adversely affect display reliability.

It would therefore be desirable to be able to provide improved displays with reduced border area and stress-relieving features.

SUMMARY

An organic light-emitting diode display may have an array of light-emitting diodes that form an array of pixels in an active area of the display. The array of pixels may be used to display images for a viewer. Each light-emitting diode may have a layer of emissive material interposed between an anode and a cathode. When current is passed between the anode and the cathode through the emissive material, the light-emitting diode will emit light.

Thin-film transistor circuitry may be used to form pixel circuits that control the current applied through the light-emitting diode of each pixel. The thin-film transistor circuitry may include transistors and thin-film capacitors and may be formed from semiconductor layers, dielectric layers, and metal layers on a substrate.

In accordance with an embodiment, a display having an active area and an inactive area surrounding the active area is provided that includes a substrate, a conductive routing structure formed on the substrate in the inactive area of the display, encapsulation layers formed over the active area of the display, a dam structure that contains the encapsulation layers within the display and that is formed directly over the conductive routing structure, and a passivation layer that is formed on the conductive routing structure and below the encapsulation layers. The encapsulation layers includes a first inorganic layer, a second inorganic layer, and an organic layer interposed between the first and second inorganic layers. The passivation layer may cover an outer edge of the conductive routing structure and may also cover lateral edges of the conductive routing structure to prevent edge corrosion during an anode etch.

In accordance with another embodiment, display circuitry is provided that includes a substrate, display pixels formed over the substrate in an active area, where the active area is surrounded by an inactive area, a first conductor formed on the substrate in the inactive area, a second conductor formed over the first conductor, a first planarization layer formed between the first and second conductors, a second planarization layer formed on the second conductor, and a pixel definition layer formed on the second planarization layer, where the first conductor is shorted to the second conductor. The first and second conductors may be configured to carry a power supply voltage such as a positive power supply voltage.

In one suitable arrangement, the display circuitry may also include a third conductor formed on the substrate in the same layer as the first conductor, a fourth conductor formed over the third conductor in the same layer as the second conductor, where the third conductor is shorted to the fourth conductor. In another suitable arrangement, the fourth conductor may be formed directly on the third conductor.

In accordance with another suitable embodiment, an electronic device display is provided that includes a flexible substrate, an array of pixels that form an active area on the flexible substrate, metal traces that extend from the active area to an inactive area on the flexible substrate across a bend region on the flexible substrate, encapsulation layers formed over the array of pixels, additional encapsulation material formed over the metal traces in the bend region, and a coating layer formed over the additional encapsulation material. The encapsulation layers may include a first inorganic encapsulation layer, a second inorganic encapsulation layer, and an organic encapsulation layer formed between the first and second encapsulation layers.

In one configuration, the additional encapsulation material includes the first inorganic encapsulation layer, the second inorganic encapsulation layer, and the organic encapsulation layer. In another configuration, the additional encapsulation material includes only the organic encapsulation layer. In yet another configuration, the additional encapsulation material includes only the first inorganic encapsulation layer. In yet another suitable configuration, the additional encapsulation material includes only the first inorganic encapsulation layer and the organic encapsulation layer. If desired, a first dam structure may surround the encapsulation layers, and a second dam structure may surround the additional encapsulation material in the bend region.

Further features of the invention, its nature and various advantages will be more apparent from the accompanying drawings and following detailed description.

DETAILED DESCRIPTION

Figure 1:
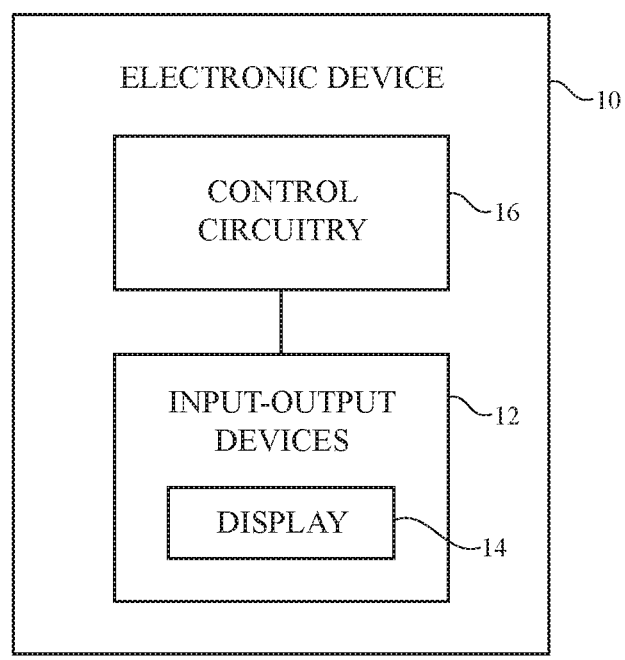
FIG. 1 is a schematic diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode display are sometimes described herein as an example. This is, however, merely illustrative. Any suitable type of display may be used, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
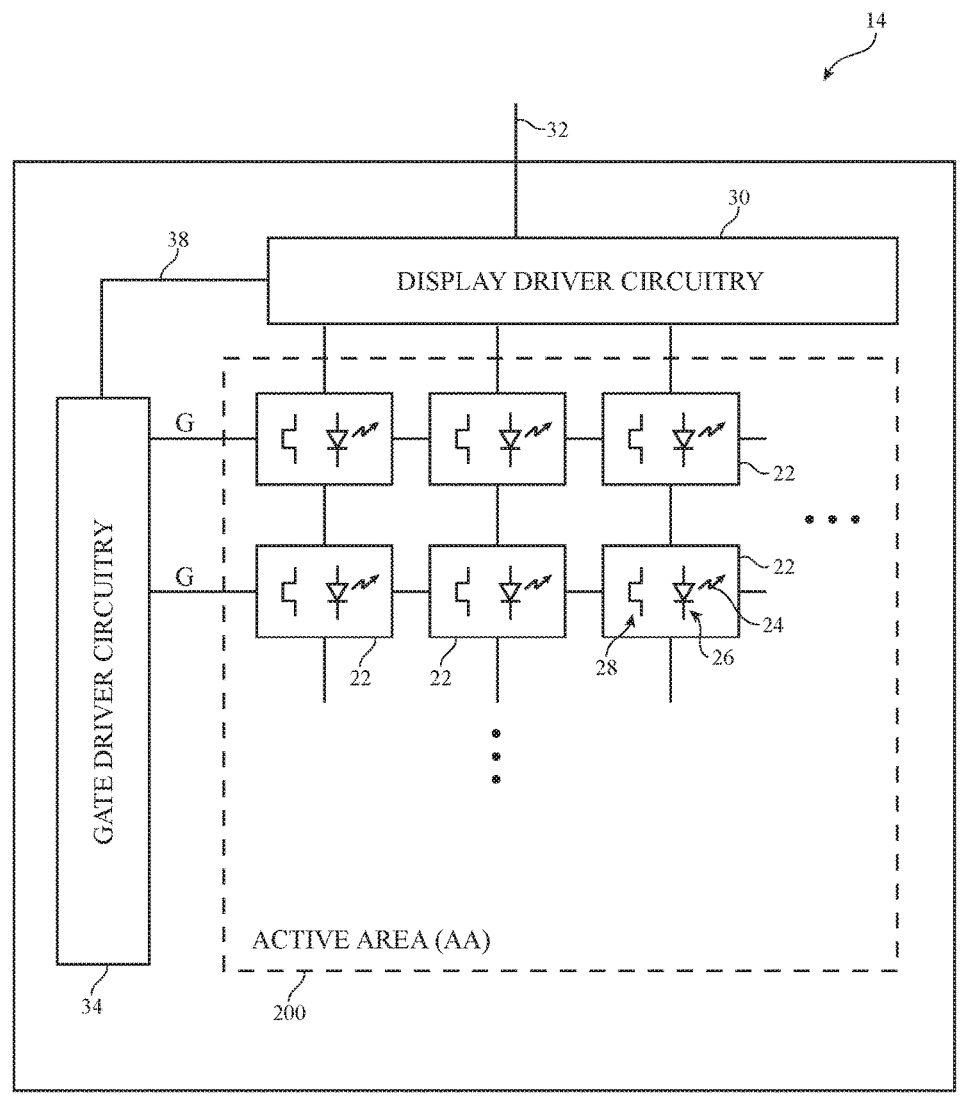
FIG. 2 is a top view of an illustrative display in an electronic device in accordance with an embodiment.

A top view of a portion of display 14 is shown in FIG. 2. As shown in FIG. 2, display 14 may have an array of pixels 22 formed on substrate 36. Substrate 36 may be formed from glass, metal, plastic, ceramic, or other substrate materials. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting-oxide thin-film transistors such as indium zinc gallium oxide transistors, or thin-film transistors formed from other semiconductors. Pixels 22 may contain light-emitting diodes of different colors (e.g., red, green, and blue) to provide display 14 with the ability to display color images.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, circuitry 30 may also supply clock signals and other control signals to gate driver circuitry on an opposing edge of display 14.

Gate driver circuitry 34 (sometimes referred to as horizontal control line control circuitry) may be implemented as part of an integrated circuit and/or may be implemented using thin-film transistor circuitry. Horizontal control lines G in display 14 may carry gate line signals (scan line signals), emission enable control signals, and other horizontal control signals for controlling the pixels of each row. There may be any suitable number of horizontal control signals per row of pixels 22 (e.g., one or more, two or more, three or more, four or more, etc.).

The region on display 14 where the display pixels 22 are formed may sometimes be referred to herein as the active area (AA) 200. The region surrounding the active area 200 wherein peripheral circuitry such as the gate driver circuitry 34 and the display driver circuitry 30 can be formed is therefore sometimes referred to as the inactive area (IA) or the border region. Images can only be displayed to a user of the device in the active region.

Figure 3:
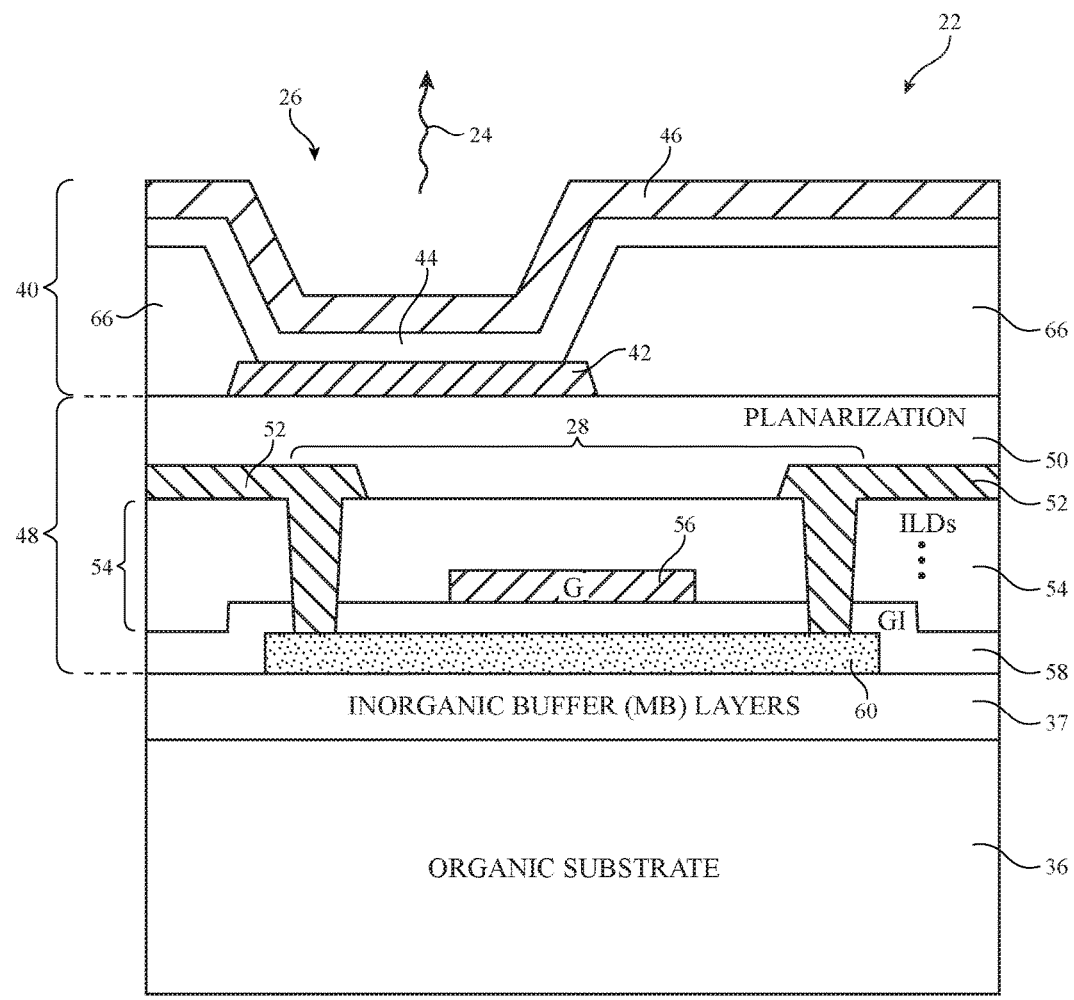
FIG. 3 is a cross-sectional side view of a portion of an illustrative organic light-emitting diode display in accordance with an embodiment.

A cross-sectional side view of an illustrative organic light-emitting diode display is shown in FIG. 3. As shown in FIG. 3, display 14 may include a substrate layer such as substrate layer 36. Substrate 36 may be a planar layer or a non-planar layer and may be formed from plastic, glass, ceramic, sapphire, metal, or other suitable materials. In the example of FIG. 3, substrate 36 may be an organic substrate formed from polyimide (PI), polyethylene terephthalate (PET), or polyethylene naphthalate (PEN) (as examples). The surface of substrate 36 may, if desired, be covered with one or more buffer layers 37 (e.g., inorganic buffer layers such as layers of silicon oxide, silicon nitride, etc.). Buffer layers 37 are sometimes referred to as multi-buffer (MB) layers.

Thin-film transistor (TFT) circuitry 48 may be formed on buffer layers 37. Thin-film transistor circuitry 48 may include transistors, capacitors, and other thin-film structures. As shown in FIG. 3, a transistor such as transistor 28 may be formed from thin-film semiconductor layer 60 in thin-film transistor layers 48. Semiconductor layer 60 may be a polysilicon layer, a semiconducting-oxide layer such as a layer of indium gallium zinc oxide (IGZO), or other semiconductor layer. Gate layer 56 may be a conductive layer such as a metal layer that is separated from semiconductor layer 60 by an intervening layer of dielectric such as dielectric 58 (e.g., an inorganic gate insulator layer such as a layer of silicon oxide).

Semiconductor layer 60 of transistor 28 may be contacted by source and drain terminals formed from source-drain metal layer 52. One or more dielectric layers 54 (e.g., inorganic dielectric layers sometimes referred to as interlayer dielectric or "ILD" layers) may separate gate metal layer 56 from source-drain metal layer 52. Source-drain metal layer 52 may be shorted to anode 42 of light-emitting diode 26 using a metal via that passes through a dielectric planarization layer 50. Planarization layer 50 may be formed from an organic dielectric material such as a polymer.

Light-emitting diode 26 may be formed from light-emitting diode layers 40 on thin-film transistor layers 48. Each light-emitting diode has a lower electrode and an upper electrode. In a top emission display, the lower electrode may be formed from a reflective conductive material such as patterned metal to help reflect light that is produced by the light-emitting diode in the upwards direction out of the display. The upper electrode (sometimes referred to as the counter electrode) may be formed from a transparent or semi-transparent conductive layer (e.g., a thin layer of transparent or semitransparent metal and/or a layer of indium tin oxide or other transparent conductive material). This allows the upper electrode to transmit light outwards that has been produced by emissive material in the diode. In a bottom emission display, the lower electrode may be transparent (or semi-transparent) and the upper electrode may be reflective.

In configurations in which the anode is the lower electrode, layers such as a hole injection layer, hole transport layer, emissive material layer, and electron transport layer may be formed above the anode and below the upper electrode, which serves as the cathode for the diode. In inverted configurations in which the cathode is the lower electrode, layers such as an electron transport layer, emissive material layer, hole transport layer, and hole injection layer may be stacked on top of the cathode and may be covered with an upper layer that serves as the anode for the diode. Both electrodes may reflect light.

In general, display 14 may use a configuration in which the anode electrode is closer to the display substrate than the cathode electrode or a configuration in which the cathode electrode is closer to the display substrate than the anode electrode. In addition, both bottom emission and top emission arrangements may be used. Top emission display configurations in which the anode is located on the bottom and the cathode is located on the top are sometimes described herein as an example. This is, however, merely illustrative. Any suitable display arrangement may be used, if desired.

In the illustrative configuration of FIG. 3, display 14 has a top emission configuration and lower electrode 42 is an anode and upper electrode 46 is a cathode. Layers 40 include a patterned metal layer that forms anodes such as anode 42. Anode 42 is formed within an opening in pixel definition layer (PDL) 66. Pixel definition layer 66 may be formed from a patterned photoimageable polymer. In each light-emitting diode 26, organic emissive material 44 is interposed between a respective anode 42 and cathode 46. Anodes 42 may be patterned from a layer of metal on thin-film transistor layers 48 such as on planarization layer 50. Cathode 46 may be formed from a common conductive layer that is deposited on top of pixel definition layer 66. Cathode 46 is transparent so that light 24 may exit light emitting diode 26 as current is flowing through emissive material 44 between anode 42 and cathode 46.

As described above, display 14 may have an active area in which pixels 22 form images for viewing by a user of device 10. The active area may have a rectangular shape. Inactive portions of display 14 may surround the active area. For example, signal traces and other support circuitry such as thin-film display driver circuitry may be formed along one or more of the four edges of display 14 that run around the rectangular periphery of display 14 adjacent to the active area. If desired, one or more display driver integrated circuits may be mounted to substrate 36 in the inactive border. For example, a flexible printed circuit on which one or more display driver integrated circuits have been mounted using solder may be attached to the border of display 14. This type of configuration is sometimes referred to as a chip-on-flex configuration and allows display driver circuitry to supply signals to the data and gate lines on display 14. Substrate 36 may be a flexible substrate.

To minimize the amount of the inactive border area of display 14 that is visible to a user, one or more edges of display 14 may be bent. As an example, the edge of display 14 to which a display driver circuit is mounted using a chip-on-flex arrangement may be folded under the active area of display 14. This helps minimize visible display borders and reduces the footprint of display 14.

Figure 4:
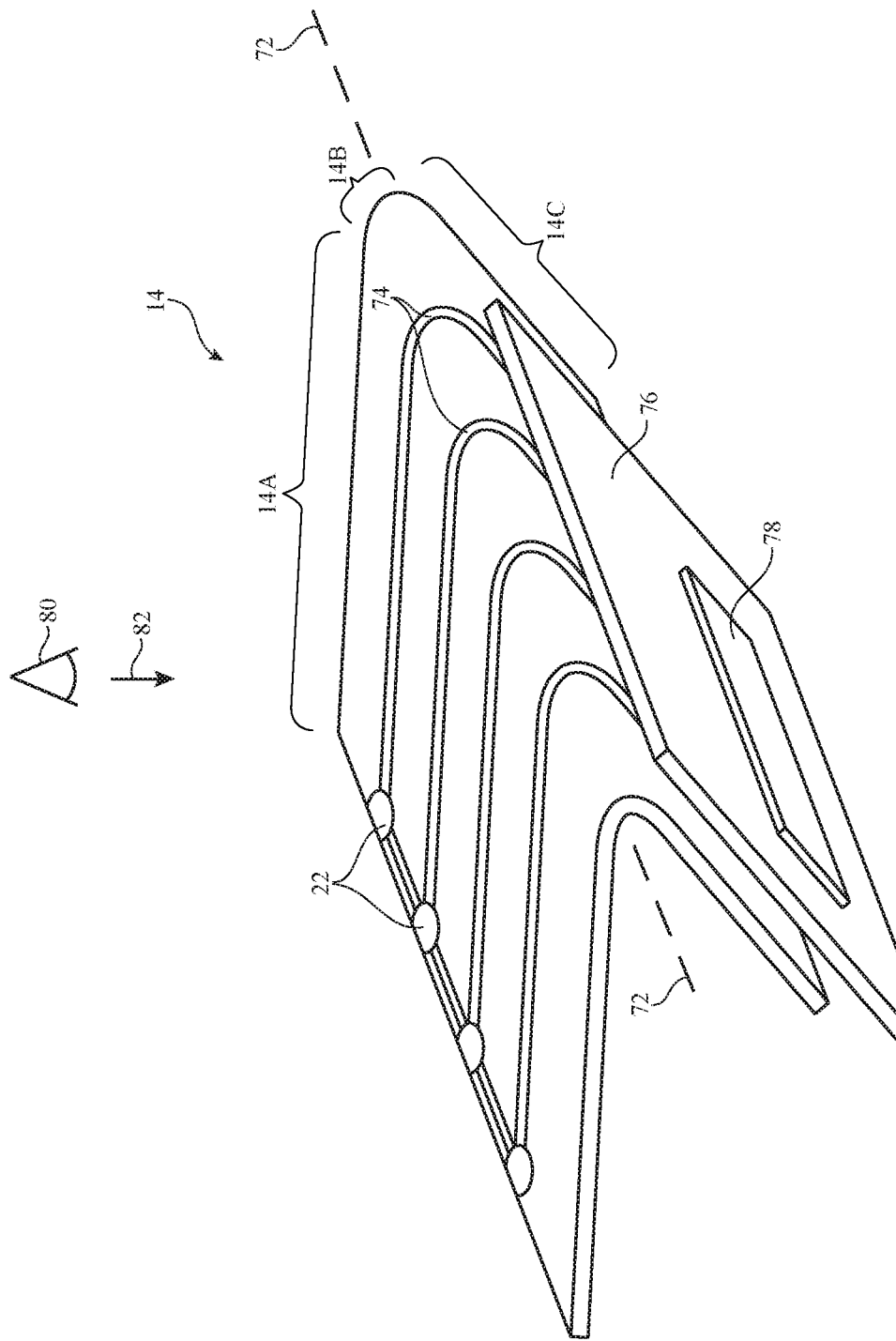
FIG. 4 is perspective view of an illustrative display with a bent portion in accordance with an embodiment.
Figure 5:
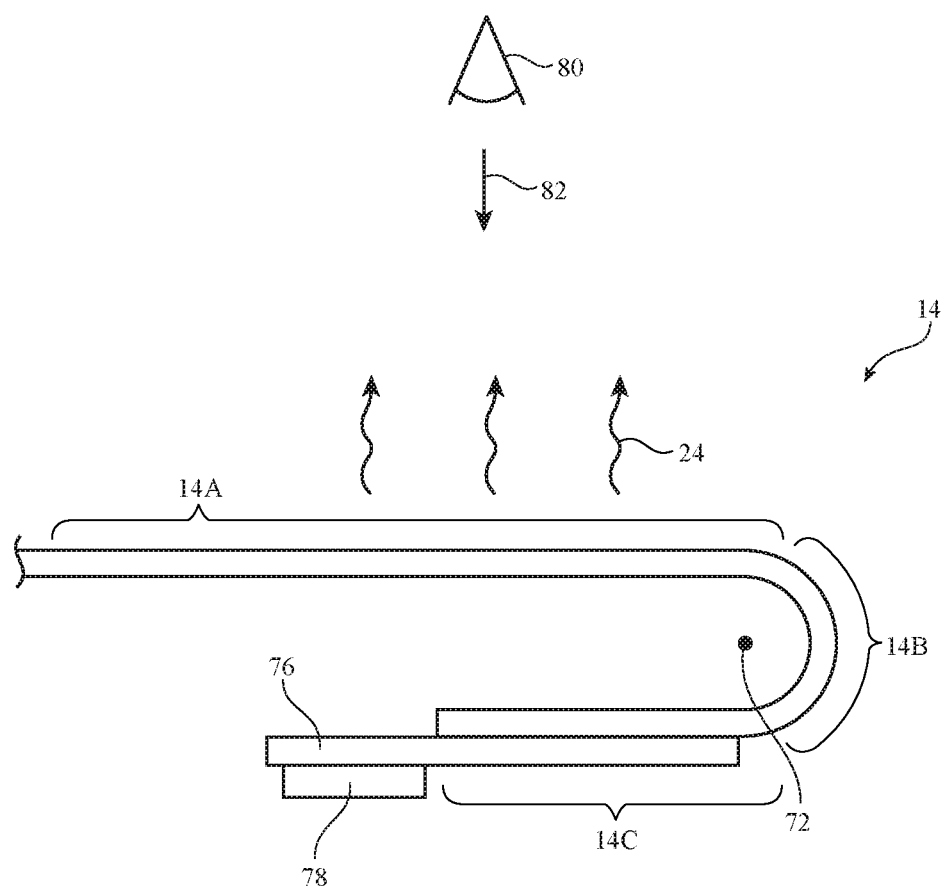
FIG. 5 is a cross-sectional side view of an illustrative display with a bent portion in accordance with an embodiment.

An illustrative display with a bent edge portion is shown in FIG. 4. As shown in FIG. 4, display 14 has portion 14A (i.e., a planar active area portion that contains the active area of display 14 that is formed by an array of pixels 22), bent portion 14B, and chip-on-flex portion 14C (i.e., an inactive display substrate portion to which flexible printed circuit 76 has been used to mount display driver integrated circuit 78 to display 14). If desired, connectors, additional integrated circuits, and/or other components may be mounted on flexible printed circuit 76. Metal traces 74 may carry signals between flexible printed circuit 76 and pixels 22 (i.e., metal traces 74 may traverse bent portion 14B of display 14). As shown in the example of FIG. 4, when bent portion 14B is bent around bend axis 72, portion 14C is folded under portion 14A and is therefore hidden from view by a user such as viewer 80 who is viewing display 14 in direction 82. FIG. 5 is a cross-sectional side view of a display of the type shown in FIG. 4 in which inactive edge portion 14C of display 14 has been bent further underneath active display portion 14A by bending display 14 about bend axis 72 in bend region 14B. Bent portion 14B may generally be formed on only one side of the display (e.g., at the top edge, bottom edge, or any other edge without gate drivers).

Figure 6:
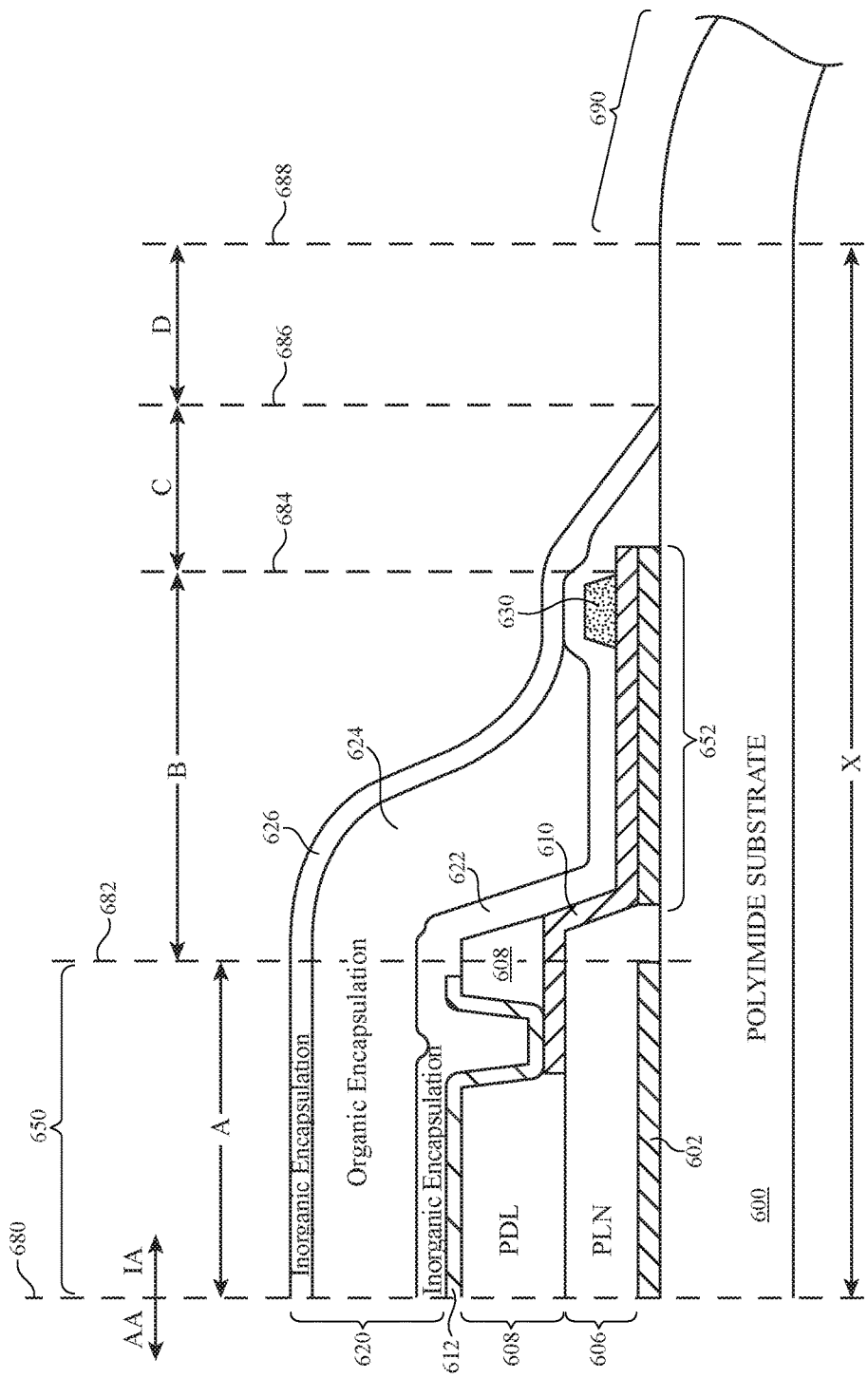
FIG. 6 is a cross-sectional side view of a conventional display with encapsulation layers and an associated dam structure.

It is generally desirable to reduce the inactive area of display 14. Reductions in the border width are, however, sometimes limited by the formation of conductive routing structures and the necessary protection layers over the conductive routing structures. FIG. 6 is a cross-sectional side view showing circuitry that is formed in the inactive area (IA) of a conventional display. As shown in FIG. 6, positive power supply VDD routing structures 602 and ground power supply VSS routing structures 604 are formed on polyimide substrate 600. A planarization layer 606 covers VDD routing structures 602. An anode layer 610 is formed on planarization layer 606 and also makes direct contact with VSS routing structures 604. A pixel defining layer 608 is formed on planarization layer 608. A cathode layer 612 may be formed on the pixel defining layer 608 and may be coupled to anode layer 610 through a via formed in the pixel defining layer 608. An emissive layer (not shown) may be interposed between anode layer 610 and cathode layer 612 to form a light-emitting diode.

Region 650 in which VDD routing structures 602 are formed may include organic light-emitting diode structures, gate driver circuitry formed using thin-film transistors, and other active circuitry. Region 652 in which VSS routing structures 604 are formed generally does not include any active circuitry. Circuitry in regions 650 and 652 have to be protected by TFT encapsulation layers such as layers 620. Encapsulation layers 620 include a first inorganic encapsulation layer 622, an organic encapsulation layer 624 formed on layer 622, and a second inorganic encapsulation layer 626 formed on layer 646. Encapsulation layers 620 formed in this way prevent moisture from damaging the conductive circuitry in the inactive border region. The circuitry in region 650 requires strong encapsulation, whereas the encapsulation requirement for the circuitry in region 652 is relatively more lax. Encapsulation layers 620 may still nevertheless cover routing structures 604.

Whenever organic encapsulation material 624 is being formed as part of the display stack-up, a dam structure 630 has to be formed in the inactive area to help contain the organic encapsulation material 624 (i.e., to help prevent the organic encapsulation material from leaking out of the border edge during formation of the encapsulation layers). Dam structure 630 is typically formed near the edge of the encapsulation layers 620. In the example of FIG. 6, dam 630 has to be formed at the edge of region 652 to ensure that the encapsulation layers 620 properly cover the circuitry in region 652.

Referring still to FIG. 6, the width of region 650 between the starting edge 680 of the inactive area and edge 682 is represented by distance A. The width between edge 682 and the outer edge 684 of dam 630 is represented by distance B. The width between edge 684 and the encapsulation margin edge 686 is represented by distance C. Distance C may represent a margin within which encapsulation layers 620 may taper off. In general, dam 630 has to be placed such that the final trailing edge of encapsulation layers 620 extends past the edge of region 652. The width between edge 686 and the bend start edge 688 (i.e., the edge marking the start of bent portion 690) is represented by distance D. The total width of the inactive area, not factoring in the bending region, is therefore represented by X, which is the sum of distances A, B, C, and D.

Distances C and D are typically fixed manufacturing constraints. Distance B in FIG. 6 is constrained by the width of region 652. If B is further reduced by shifting the position of dam structure 630 towards edge 682, it is possible that the trailing edge of encapsulation layers 620 will fail to completely cover VSS routing structures 604 and leave some of the circuitry in region 652 unprotected, which can lead to undesirable moisture ingress into the display.

Figure 7A:
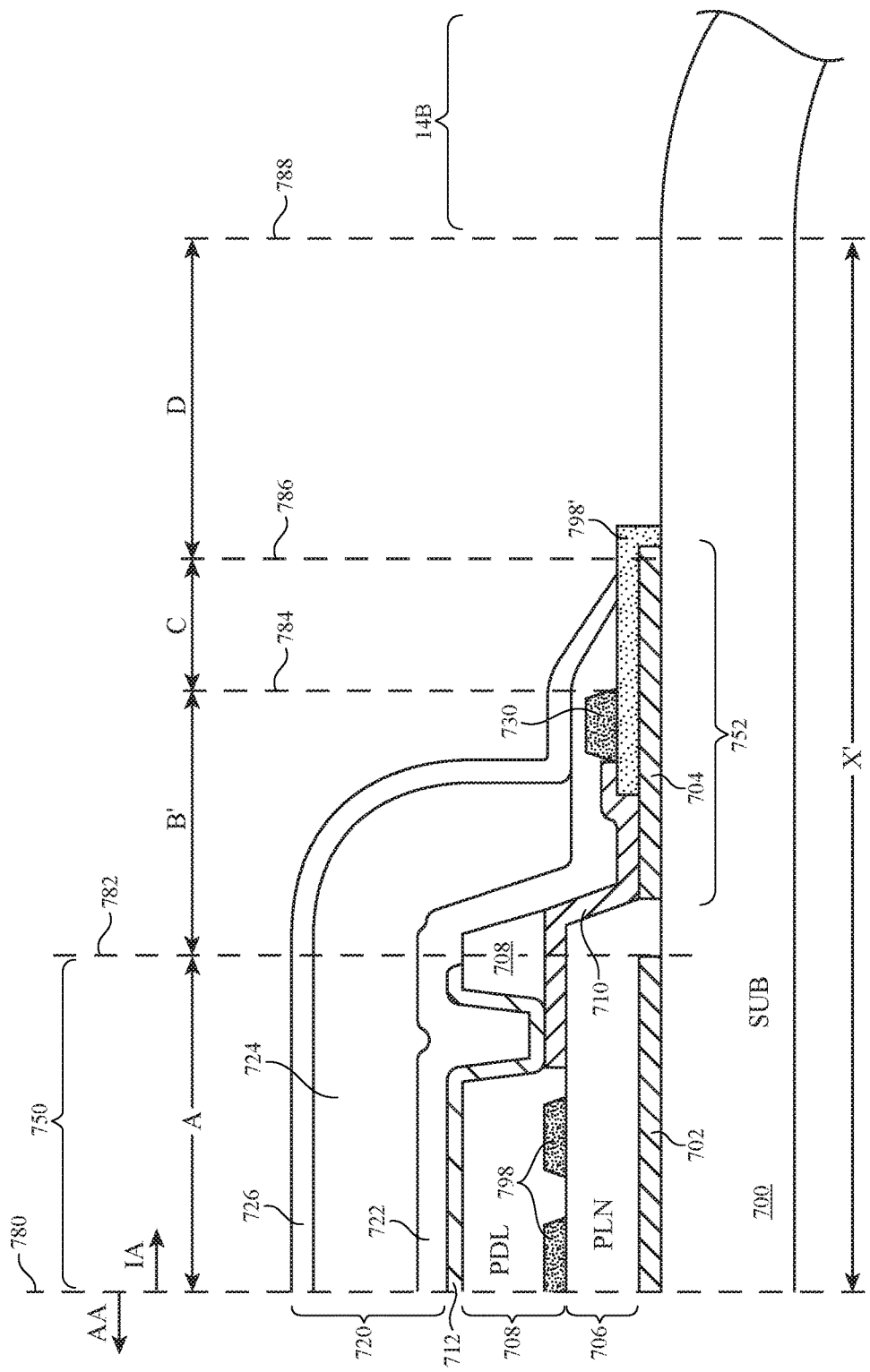
FIG. 7A is a cross-sectional side view of an illustrative display with a thin-film transistor (TFT) passivation layer that covers display border region power routing structures in accordance with an embodiment.

In accordance with an embodiment of the present invention, an additional TFT passivation layer is introduced that helps to protect the VSS routing structures, which helps to relax the requirement on the position of the dam structure (see, e.g., FIG. 7A). As shown in FIG. 7A, power supply routing structures 702 and 704 may be formed on substrate 700. Substrate 700 may be flexible. In one embodiment, structures 702 may be used to convey positive power supply voltages while structures are used to convey ground power supply voltages. In other suitable embodiments, structures 702 may be used to convey ground voltages while structures 704 are used to conveyed positive power supply voltages. A planarization (PLN) layer 706 may cover routing structures 702. In general, region 750 in which routing structure 702 are formed may also include TFT structures forming gate drivers and other active circuitry.

An inorganic passivation layer 712 may be disposed over planarization layer 706 to help passivate any TFT structures formed in the display. Passivation layer 712 may also be selectively patterned to provide the desired coverage. In particular, passivation layer 798' may also be formed directly on structures 704 to help protect the outer edge of structures 704 in region 752. Thereafter, anode layer 710 may be formed on planarization layer 706, also making direct contact with routing structures 704. Pixel definition layer (PDL) 708 may be formed on planarization layer 708. A cathode layer 712 may be formed on PDL layer 708 and may be coupled to anode layer 710 through a via formed in layer 708. An emissive layer (not shown) may be interposed between anode layer 710 and cathode layer 712 to form an organic light-emitting diode (OLED).

To ensure proper moisture protection for the display circuitry in the active area (AA) and the active circuits in region 750, TFT encapsulation layers 720 may be formed. Encapsulation layers 720 may include a first inorganic encapsulation layer 722, an organic encapsulation layer 724 (e.g., a polymer layer) formed on layer 622, and a second inorganic encapsulation layer 726 formed on layer 746. To help contain the organic polymer material 724 during formation of the encapsulation layers 720, one or more dam structures 730 may be formed in region 752 (e.g., at least two dams may be formed, at least three dams may be formed, etc.).

Referring still to FIG. 7A, the width of region 750 between the starting edge 780 of the inactive area and edge 782 is represented by distance A. The width between edge 782 and the outer edge 784 of dam 730 is represented by distance B'. The width between edge 784 and the encapsulation margin edge 786 is represented by distance C. Distance C may represent a margin within which encapsulation layers 720 may taper off. The width between edge 786 and the bend start edge 788 (i.e., the edge marking the start of bent portion 14B) is represented by distance D. The total width of the inactive area, not factoring in the bending region, is therefore represented by X', which is the sum of distances A, B', C, and D.

Comparing FIG. 7A to 6, distance B' is substantially reduced since the position of dam 730 has been shifted towards edge 782. As shown in FIG. 7A, the position of dam 730 results in encapsulation layers 720 tapering off before the edge of region 752, but this is acceptable since TFT passivation layer 798' (e.g., an inorganic layer) is already protecting the edge of structures 704. The use of inorganic TFT passivation layer 798', which is the last inorganic layer formed as part of the TFT structures, therefore reduces distance B' by allowing dam 730 to be formed away from the very edge of region 752. The overall width X' of the inactive border active is therefore reduced in comparison to FIG. 6.

Figure 7B:
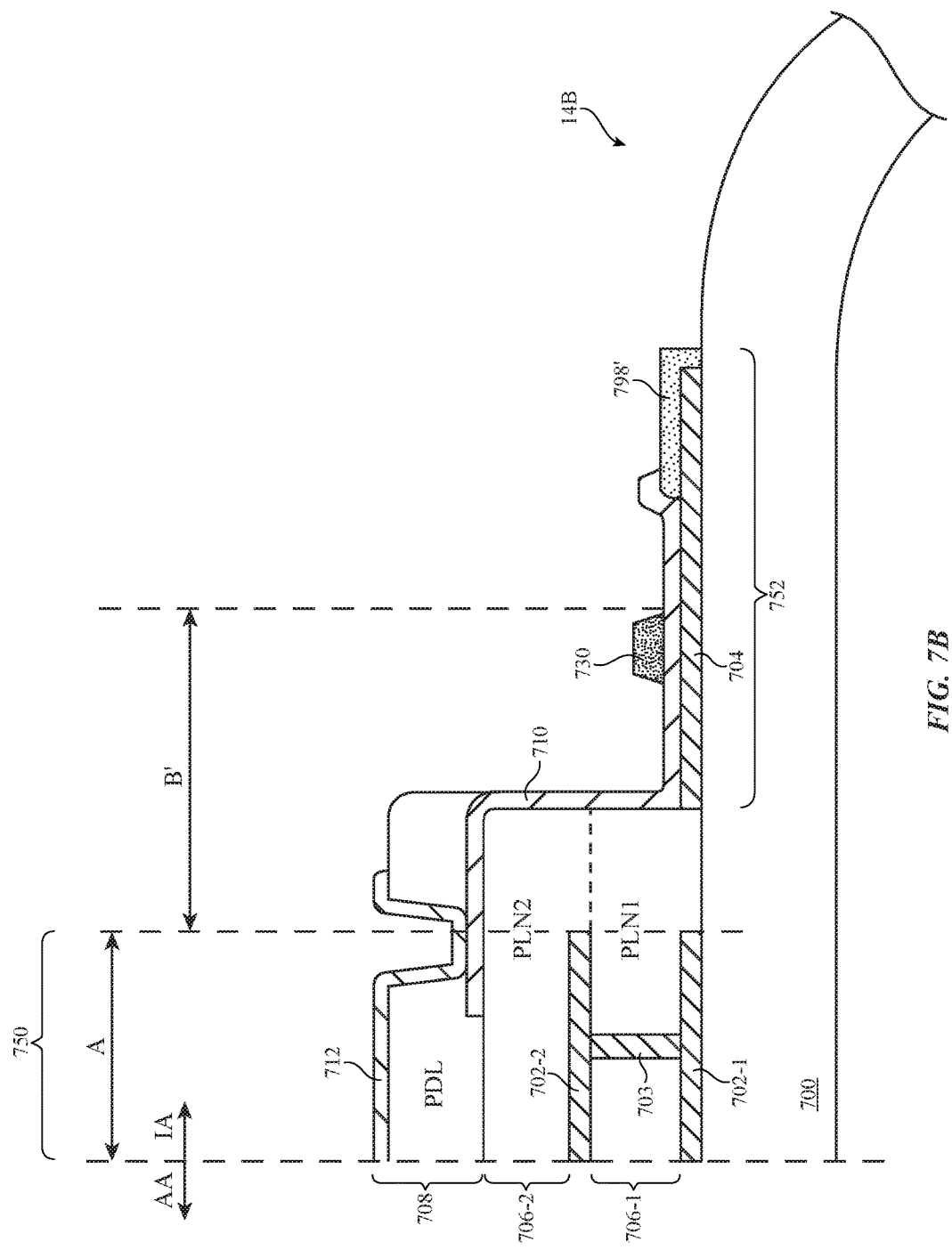
FIGS. 7B-7D are cross-sectional side views of illustrative displays with stacked conductive routing structures in accordance with multiple embodiments.

In accordance with another suitable embodiment, the width of the inactive border area can also be reduced by stacking routing structures 702. As shown in FIG. 7B, the power supply routing structures in region 750 may be split into a first conductive layer 702-1 that is formed on substrate 700 and a second conductive layer 702-2 that is formed above layer 702-1. A first planarization layer 706-1 is formed between layers 702-1 and 702-2, whereas a second planarization layer 706-2 is formed between conductive layer 702-2 and PDL layer 708. Conductive layers 702-1 and 702-2 may be coupled in parallel using one or more via structures 703 formed through first PLN layer 706-1. By stacking and coupling metal routing structures 702-1 and 702-2 in parallel, the width A' of region 750 can be halved (i.e., distance A' in FIG. 7B can be 50% of distance A in FIG. 7A).

The example of FIG. 7B shows TFT passivation layers 798' formed on structures 704. This need not be the case. The techniques of FIGS. 7A and 7B are not mutually exclusive but may be used independently of one another as desired (e.g., the example of FIG. 7B need not include layer 798' but in such scenarios, dam 730 may have to be shifted to the edge of region 752). The encapsulation layers 720 of FIG. 7A are not shown in FIG. 7B so as to not unnecessarily obscure the present embodiment.

Figure 7C:
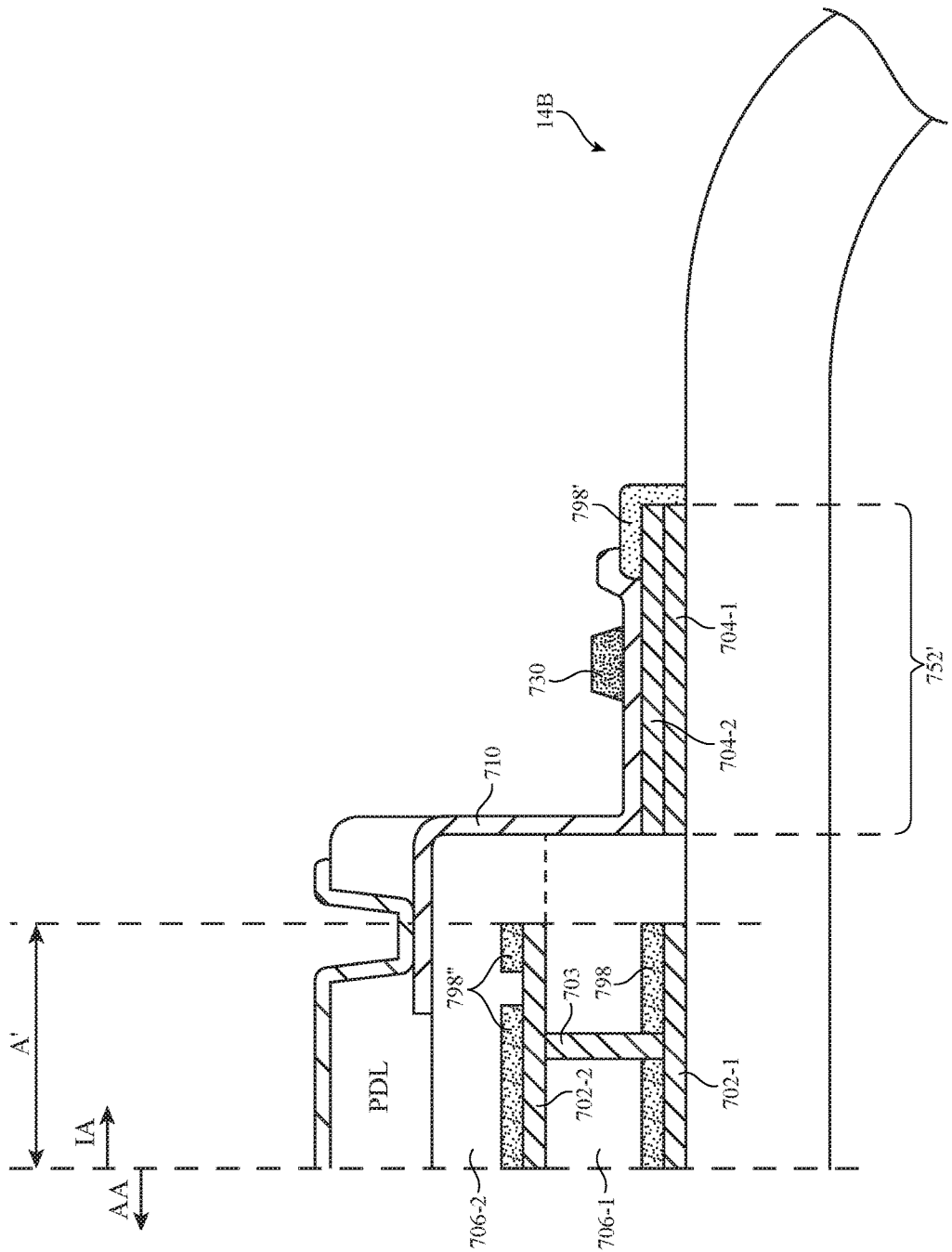

The technique of FIG. 7B can also be applied to region 750. As shown in FIG. 7C, the power supply routing structures in region 752' may also be split into a first conductive layer 704-1 that is formed on substrate 700 and a second conductive layer 704-2 that is formed directly on layer 702-1. By stacking metal routing structures 704-1 and 704-2 directly on top of each other, the width of region 752' can be halved (i.e., the width of region 752' in FIG. 7C may be 50% of the width of region 750 in FIGS. 7A and 7B).

The example of FIG. 7C shows TFT passivation layers 798' formed on structures 704-2. This need not be the case. The techniques of FIGS. 7A and 7C are not mutually exclusive but may be used independently of one another as desired (e.g., the example of FIG. 7C need not include layer 798' but in such scenarios, dam 730 may have to be shifted to the edge of region 752'). The encapsulation layers 720 of FIG. 7A are not shown in FIG. 7C so as to not unnecessarily obscure the present embodiment.

Figure 7D:
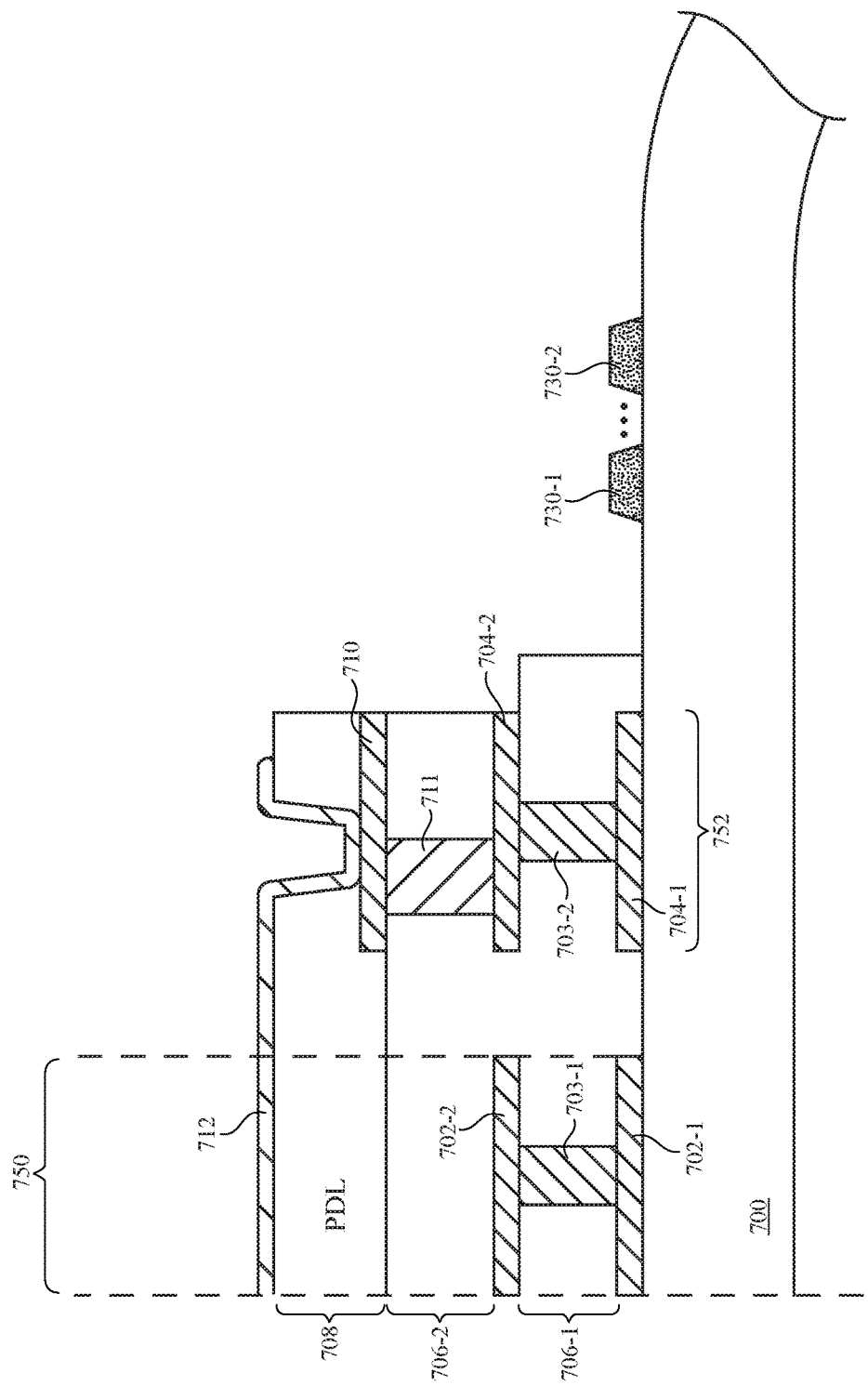

In yet another suitable embodiment, the width of both regions 750 and 752 can be halved by using the double planarization layer configuration. As shown in FIG. 7D, first metal layer 702-1 in region 750 and first metal layer 704-1 in region 752 may be formed on substrate 700. Second metal layer 702-2 in region 750 and second metal layer 704-2 in region 752 may be formed over first metal layers 704-1 and 704-2, respectively. First planarization layer 706-1 may be interposed between layers 702-1 and 702-2 and also between layers 704-1 and 704-2. Second planarization layer 706-2 may be interposed between layers 702-2 and PDL layer 708 and between layers 704-2 and PDL layer 708.

One or more conductive vias 703-1 formed through first PLN layer 706-1 may connect layers 702-1 and 702-2 in parallel, whereas one or more conductive vias 703-2 formed through first PLN layer 706-1 may connect layers 704-1 and 704-2 in parallel. Metal layer 704-2 may be coupled to anode layer 710 through via 711. Configured in this way, both regions 750 and 752 may be halved in comparison with FIG. 7A. In the example of FIG. 7D, one or more dam structures (e.g., dam structures 730-1, 730-2, etc.) may be formed beyond region 752 to help contain the encapsulation material (not shown).

Figure 7E:
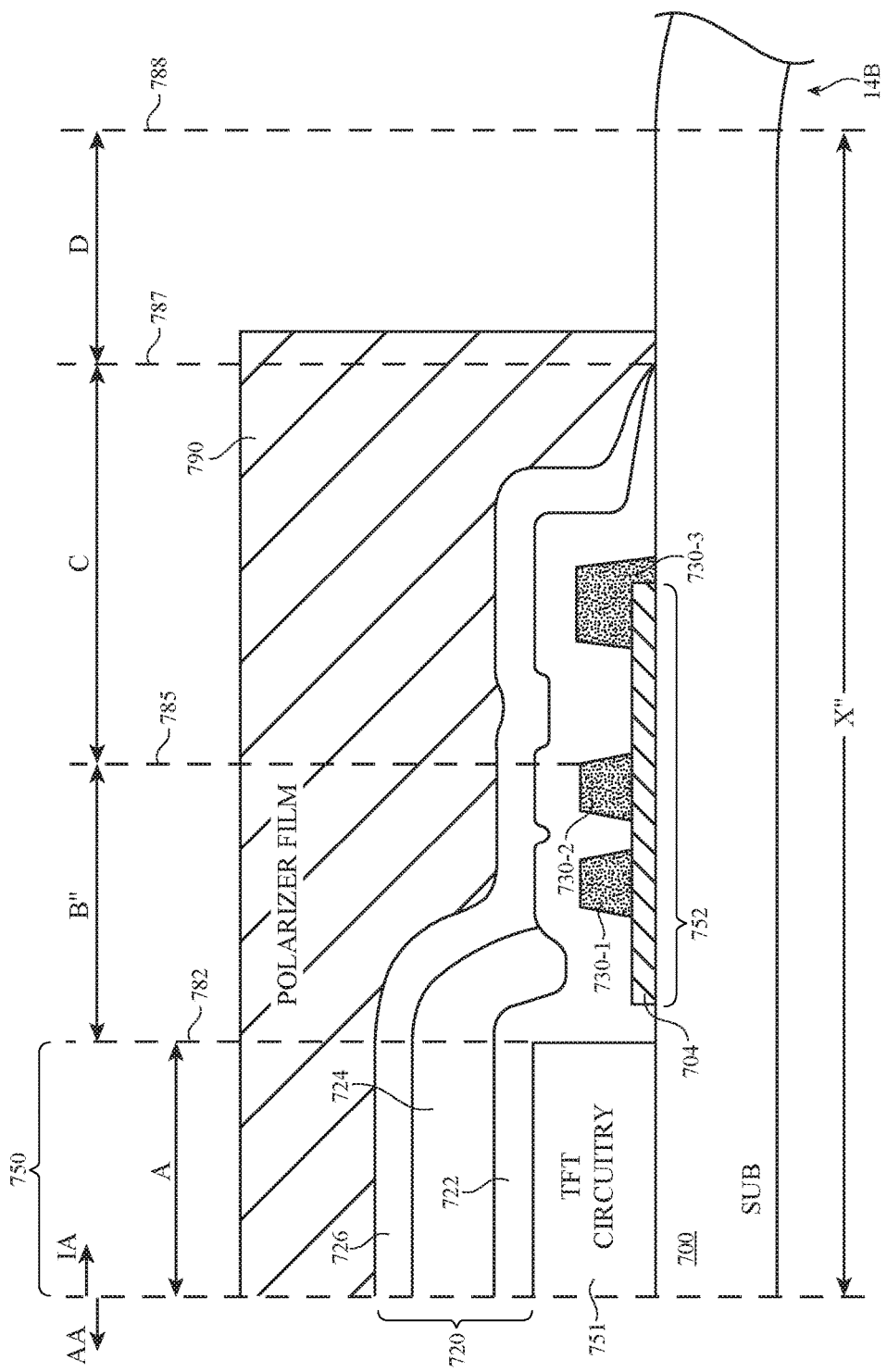
FIG. 7E is a cross-sectional side view of an illustrative display with a triple dam configuration for reducing border width in accordance with an embodiment.

In some embodiments, a single dam structure might not be sufficient to help contain organic material 724. In such scenarios, more than one dam structure 730 may be formed in region 752 to help restrict the organic flow (see, e.g., FIG. 7E). As described above, encapsulation layers 720 may be formed over TFT circuitry 751, which may include gate drivers and other active circuitry in the inactive border region. In the example of FIG. 7E, a first dam such as dam structure 730-1 may be formed closest to region 750 to help restrict the flow of organic material 724, a second dam such as dam structure 730-2 may be formed adjacent to dam structure 730-2 to ensure proper containment of organic material 724, and a third dam such as dam structure 730-3 may be formed at the outer edge of region 752 to help provide step coverage for conductive routing line 704. Dam 730-3 formed in this way can help smooth out the transition at the outer edge of conductive routing line 704.

The width between edge 782 and the outer edge 785 of dam 730-2 is represented by distance B". The width between edge 785 and the encapsulation margin edge 787 is represented by distance C. Distance C may represent a margin within which encapsulation layers 720 may taper off and may therefore sometimes referred be to as the encapsulation margin. The width between edge 787 and bend start edge 788 (i.e., the edge marking the start of bent portion 14B) is represented by distance D. The total width of the inactive area, not factoring in the bending region, is therefore represented by X", which is the sum of distances A, B", C, and D.

Comparing FIG. 7E to FIG. 7A, distance B" may be slightly greater since two dams are required to contain the organic flow, effectively shifting out the starting edge of the encapsulation margin. The absolute value of the encapsulation margin C has not changed from FIG. 6 to FIG. 7 (note that the distances in FIGS. 6 and 7 are not necessarily drawn to scale). In FIG. 6, the encapsulation margin begins at the very edge of region 652. In FIG. 7E, however, the encapsulation margin begins at the edge of dam 730-2 and therefore has some amount of overlap with region 752, which helps to reduce the total border width. When the border width is reduced in this way, an upper polarizer film such as polarizer film 790 may completely cover the edge of inorganic encapsulation layers 722 and 726. Complete coverage of the inorganic encapsulation layers, which are sometimes prone to cracks due to vibrations or physical impact when exposed, can help provide improved mechanical robustness. Although not explicitly shown, the formation of passivation layer 798' can optionally be applied to the embodiment of FIG. 7E.

Figure 8A:
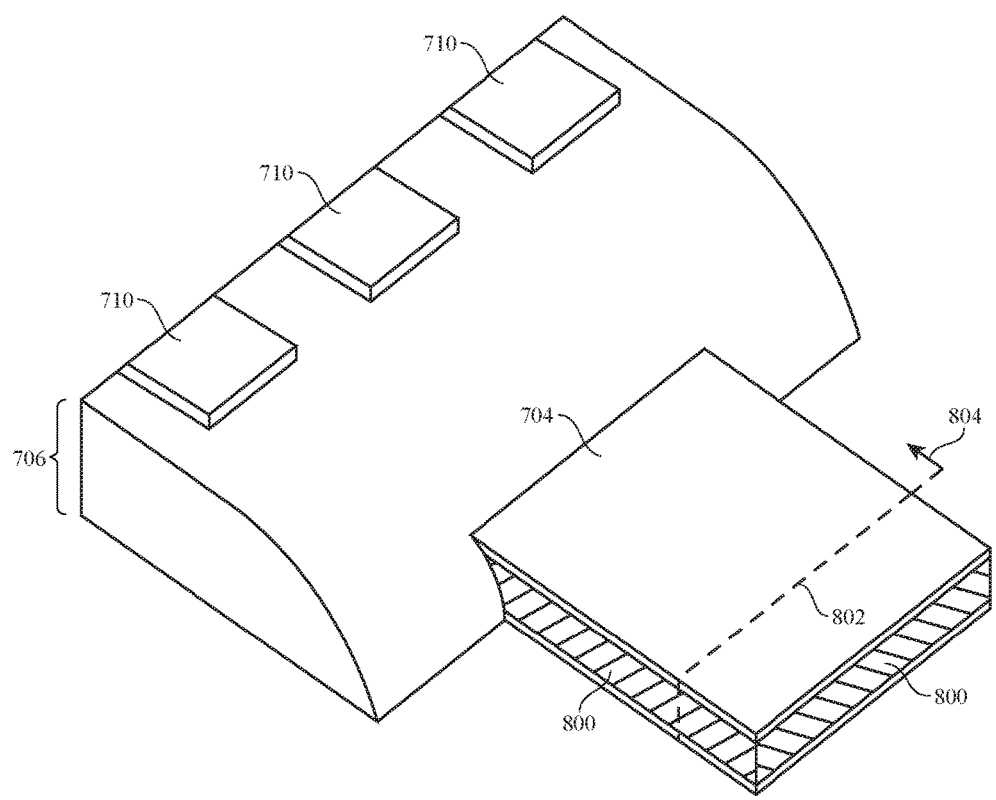
FIG. 8A is a perspective view of a display border region power routing line that may be susceptive to edge corrosion.

FIG. 8A is a perspective view showing how a conductive routing line 704 in region 752 may be susceptible to edge corrosion. As shown in FIG. 8A, anode layer 710 may be formed and patterned on PLN layer 706. Since conductive structure 704 (sometimes referred to as a "source-drain" metal) is exposed by PLN layer 706, at least a portion of structure 704 may be corroded when anode layer 710 is being patterned. For example, to form anode structures 710, a blanket anode layer may be deposited over PLN layer 706 and over routing line 704. A mask may then be used to selectively etch the blanket anode layer so that only the desired portions remain. Due to the chemical composition of routing line 704, the etching process may result in corrosion at the edges of routing line 704, as shown by shaded region 800 in FIG. 8A.

Figure 8B:
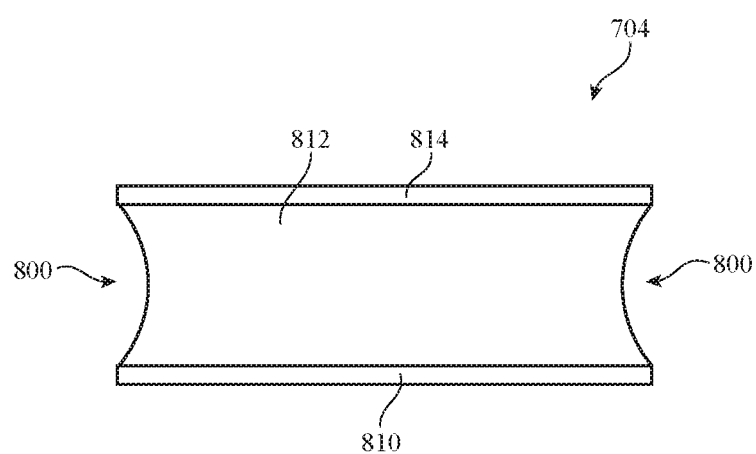
FIG. 8B is a cross-sectional side view showing the edge corrosion of the display border region power routing line of FIG. 8A.

The edge corrosion can be readily observed in FIG. 8B, which shows the cross-sectional view of routing line 704 cut along line 802 and viewed in direction 804 (FIG. 8A). Routing line 704 may include a first conductive layer 810, a second conductive layer formed on the first conductive layer 810, and a third conductive layer 814 formed on the second conductive layer 812. The first and third conductive layers 810 and 814 may be formed from the same material, whereas the sandwiched layer 812 may be formed from a different material than layers 810 and 814. As an example, layers 810 and 814 may be formed from titanium while interposing layer 812 is formed from aluminum. This is merely illustrative. In general, layers 810, 812, and 814 may be formed from any suitable conductive material.

As shown in FIG. 8B, layer 812 may be especially susceptible to the anode etchant material, which can result in undercut 800 on either edges of routing line 704. This corrosion can result in a pathway for moisture to permeate into the device and can lead to electrical failure of the display panel.

Figure 8C:
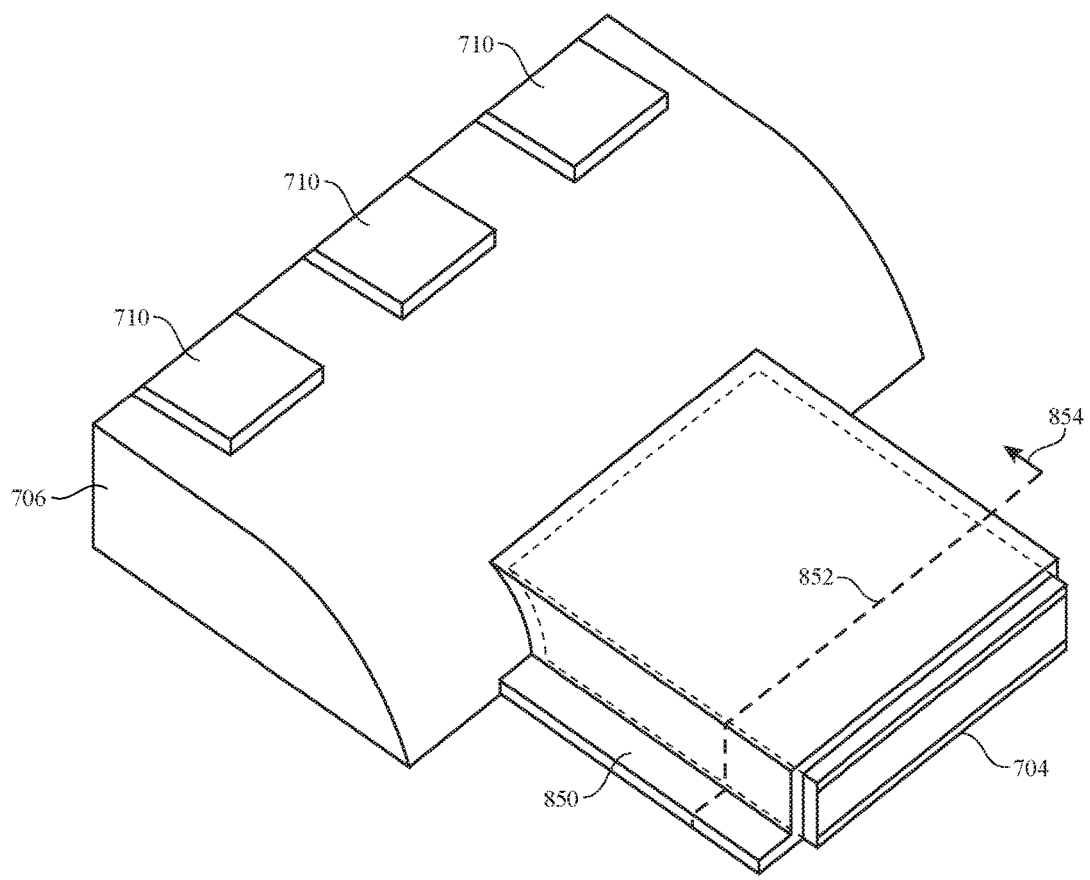
FIG. 8C is a perspective view showing how a TFT passivation layer may be formed over a display border region power routing line to help prevent edge corrosion in accordance with an embodiment.

In an effort to prevent this undesired undercutting of source-drain metal 704, an etch protection layer such as protection layer 850 may be deposited over routing line 704 prior to anode formation (see, e.g., FIG. 8C). As shown in the perspective view of FIG. 8C layer 850 may be formed over the top and covering the lateral side edges of routing line 704. In particular, layer 850 may be the same TFT passivation layer 798' that is formed in connection with FIGS. 7A-7C.

Figure 8D:
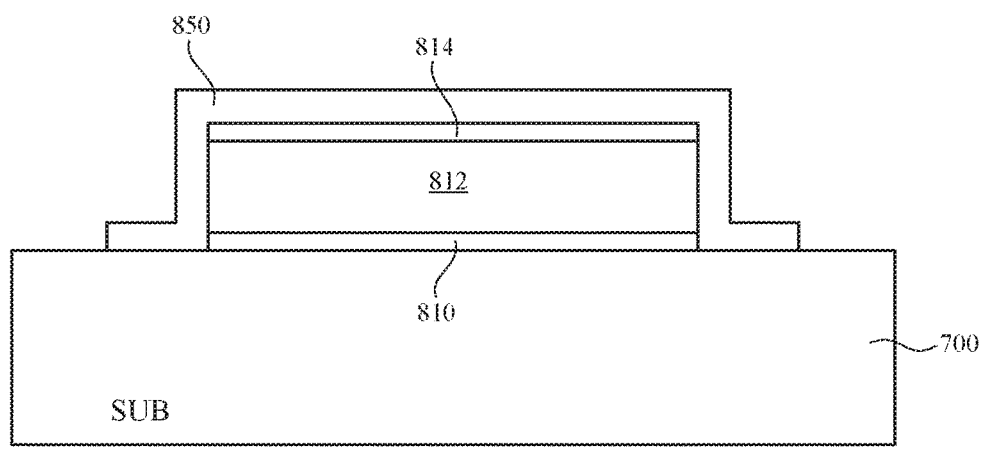
FIG. 8D is a cross-sectional side view of the TFT passivation layer that is formed on the display border region power routing line of FIG. 8C in accordance with an embodiment.

FIG. 8D shows a cross-sectional side view of routing line 704 cut along line 852 and viewed in direction 854 (FIG. 8C). As shown in FIG. 8D, passivation layer 850 (e.g., an inorganic layer) may cover the side edges of conductive routing line 704. Configured in this way, subsequent formation and patterning of the anode layer will not corrode routing line 704 since material 812 is protected from the anode etchant by inorganic layer 850. Thus, the TFT passivation layer may not only cover the outer edge of routing structures 704 to help reduce the inactive border width (as shown in FIGS. 7A-7C) but may also cover the side edges of routing structures 704 to prevent edge corrosion during formation and patterning of the anode layer.

As described above, stresses can be imparted to display structures in a flexible display when the display is bent. For example, metal traces such as metal traces 74 of FIG. 4 that are used to form signal lines that convey signals between display driver circuitry 78 and pixels 22 may be subjected to bending stresses in bend region 14B. To minimize bending stress and thereby minimize cracks in metal traces 74, it may be desirable to align the neutral stress plane of display 14 in bend region 14B with metal traces 74 or at least shift the neutral stress plane with respect to metal traces 74.

Figure 9:
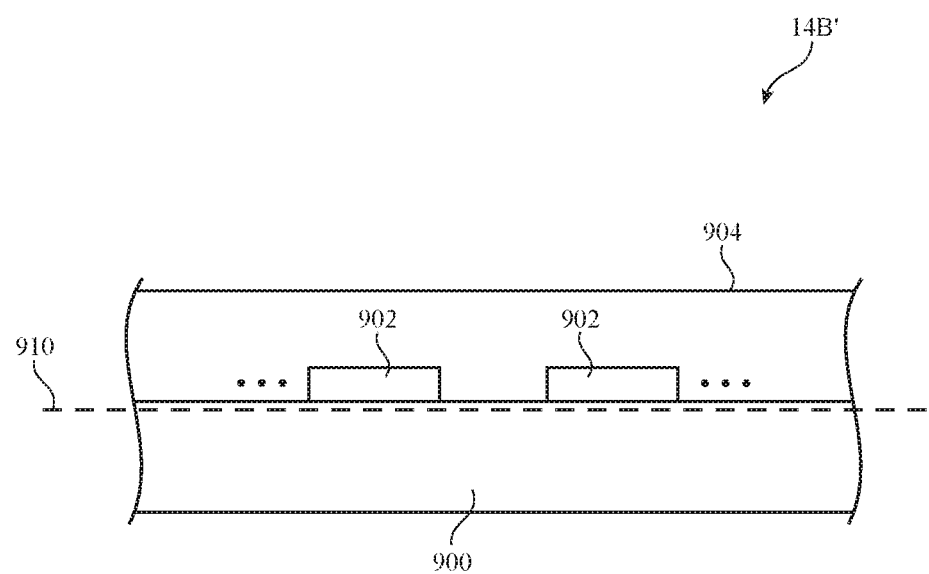
FIG. 9 is a cross-sectional side view of an illustrative bent substrate showing how a neutral stress plane may be aligned with metal traces on the substrate in accordance with an embodiment.

In the example of FIG. 9, when a portion of display 14 is bent in region 14B', some layers such as substrate 900 may be subjected to compressive stress and some layers such as coating layer 904 may be subjected to tensile stress. Neutral stress plane 910 arises where stress has been eliminated by balancing the compressive stress and tensile stress. The shape of neutral stress plane 910 may be curved in a curved portion of display 14 such as portion 14B' of FIG. 9 (i.e., neutral stress plane 910 may have a curved profile).

The relative thicknesses of substrate 900 and coating 904 and the relative modulus of elasticity values for substrate 900 and coating 904 determine the location of the neutral stress plane within the layers of bent display region 14B. For example, if the modulus of elasticity of substrate 900 and coating 904 is the same, neutral stress plane 910 can be aligned with metal traces 902 by ensuring that coating 904 has the same thickness as substrate 900. If, on the other hand, coating 904 has a modulus of elasticity that is larger than that of substrate 900, coating 904 need not be as thick as substrate 900 to balance the compressive and tensile stresses. Because the thickness of coating 904 can be selected so that neutral stress plane 910 is aligned with metal traces 902, layer 904 may sometimes be referred to as a neutral stress plane adjustment layer. Layer 904 may be formed from one or more polymer layers or other layers of material (e.g., organic layer(s), inorganic layer(s), and/or combinations of organic and inorganic layers). To facilitate bending and reduce the thickness needed for layer 904, it may be desirable to thin some or all of substrate 900.

Figure 10:
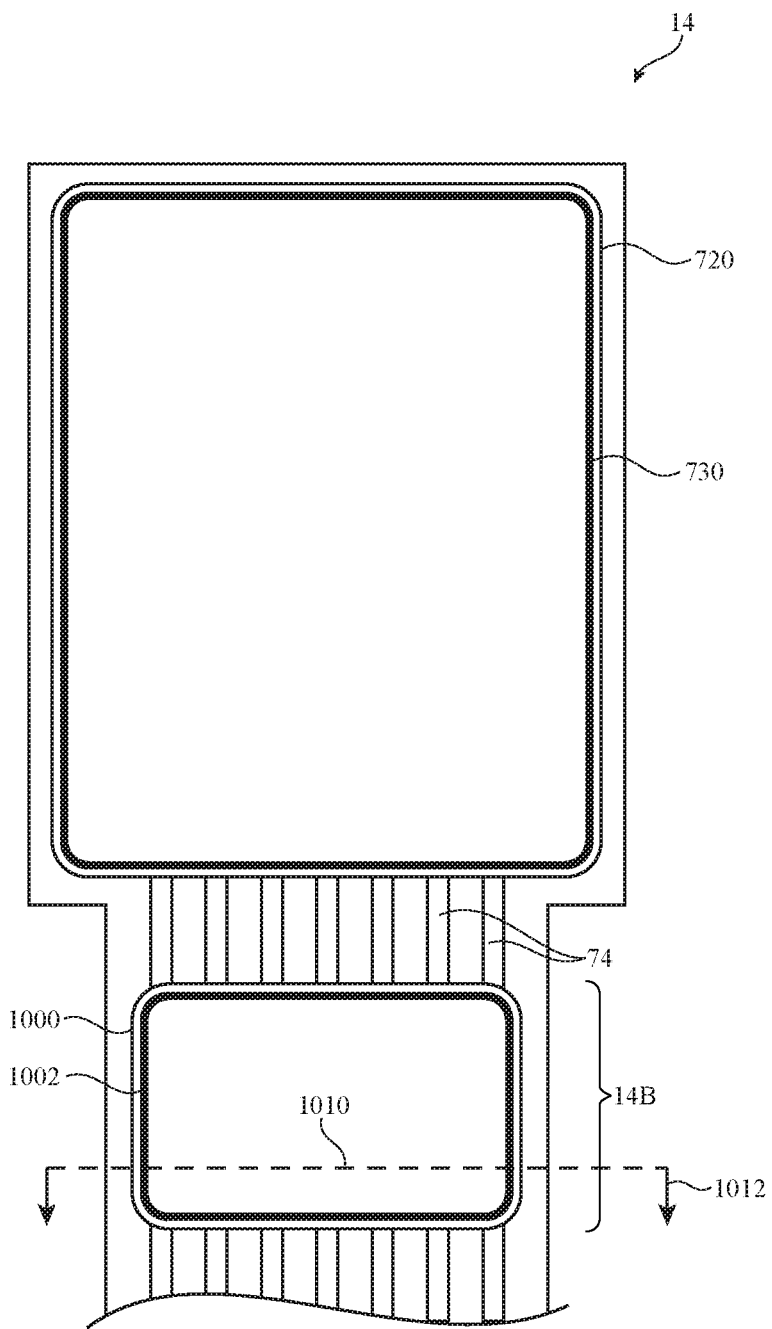
FIG. 10 is a top view of an illustrative display showing how encapsulation material may be formed over the active area and over the bent portion in accordance with an embodiment.

In accordance with another embodiment of the present invention, at least some of the TFT encapsulation layers may be formed in the bent portion to adjust the placement of the neutral stress plane. FIG. 10 is a top view of display 14 showing how encapsulation layers 720 may be formed over the display panel and also how one or more encapsulation layers 1000 may be formed within bent portion 14B. Encapsulations layers 720 and 1000 may be formed at the same time. As shown in FIG. 10, dam structure 730 may form a ring at the periphery of encapsulation layers 720 to help contain the organic polymer material within layers 720. Similarly, dam structure 1002 may also be formed at the periphery of encapsulation layer(s) 1000. Configured in this way, encapsulation layer(s) 1000 can either be used to align the neutral stress plan to metal traces 74 or above metal traces 74 such that traces 74 only experience compressive stress. Metal traces 74 may generally be able to withstand a higher less of compressive stress than tensile stress prior to cracking.

Figure 11A:
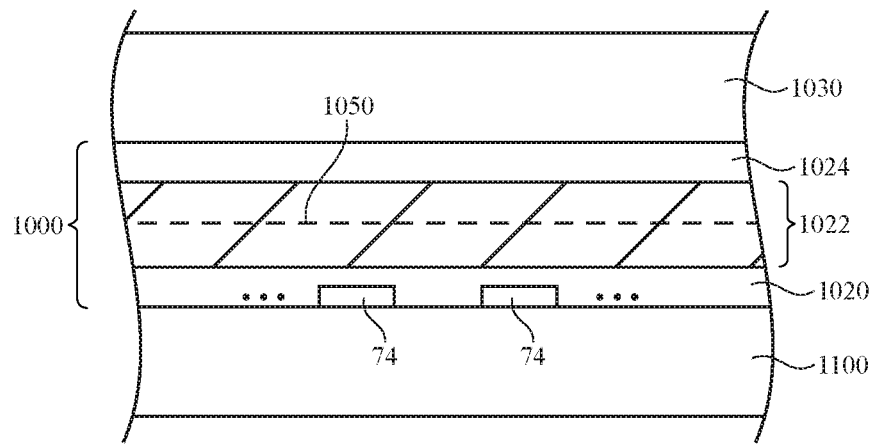
FIGS. 11A-11F are cross-sectional side views of illustrative displays with one or more encapsulation adjustment layers for shifting the neutral stress plane in accordance with multiple embodiments.

FIG. 11A shows a cross-sectional side view of encapsulation layers 1000 cut along line 1010 and viewed in direction 1012 (FIG. 10). As shown in FIG. 11A, metal traces 74 may be formed on substrate 1100, which may be integral with substrate 700; a polymer coating layer (sometimes referred to as a cover layer) 1030 may be formed over metal traces 74; and encapsulation layers 1000 may be interposed between metal traces 74 and coating layer 1030. Substrate 110 may be a flexible substrate.

Encapsulation layers 1000 may include a first inorganic layer 1020, an organic layer 1022, and a second inorganic layer 1024. Layers 1020, 1022, and 1024 may be identical in substance and may be formed at the same time as layers 722, 724, and 726 in FIG. 7A. Formed in this way, encapsulation layers 1000 may shift the neutral stress plane to position 1050 such that metal traces 74 lie below the neutral stress plane and experience compressive stress in bent portion 14B.

Figure 11B:
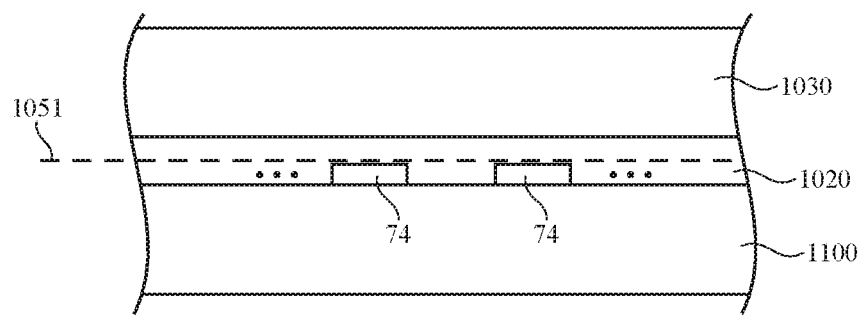
Figure 11C:
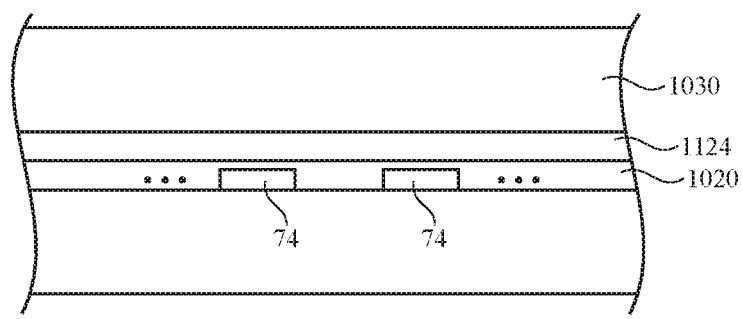

FIG. 11B show another suitable embodiment in which only layer 1020 is formed between substrate 1100 and coating layer 1030 in the bent region. Configured in this way, the neutral stress plane may be aligned to metal traces 74 at position 1051 so that metal traces 74 experience neither compressive stress nor tensile stress during bending. FIG. 11C shows yet another suitable embodiment in which only layers 1020 and 1024 are formed between substrate 1100 and coating layer 1030 in the bent region (e.g., organic layer 1022 need not be formed in the bent portion). If desired, dam structure 1002 can be left out if organic layer 1022 is not formed in the bent portion.

Figure 11D:
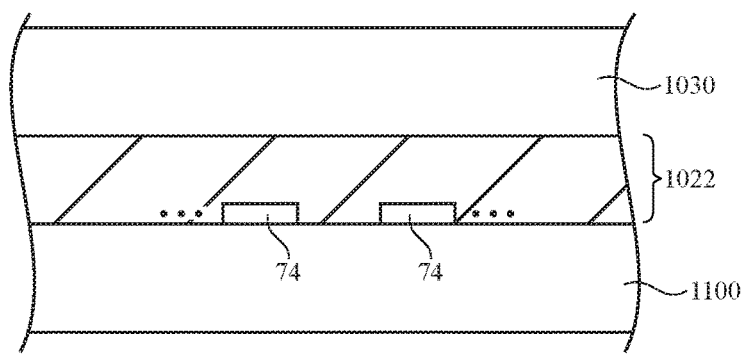
Figure 11E:
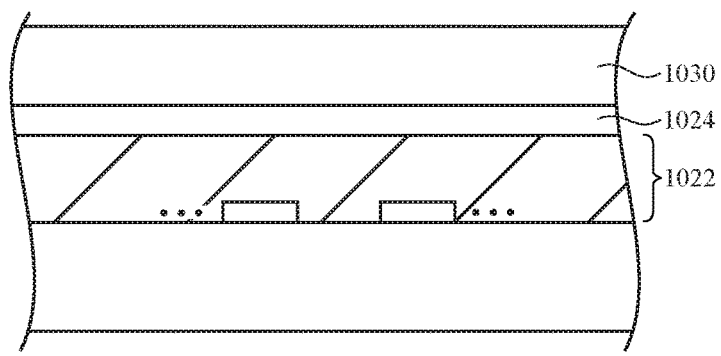
Figure 11F:
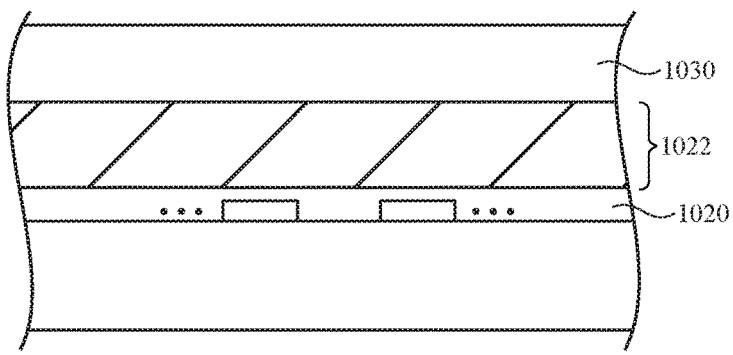

FIG. 11D shows yet another suitable arrangement in which only the organic layer 1022 is formed between substrate 1100 and coating layer 1030 in the bent portion. As long as organic layer 1022 is formed, one or more ring-shaped dam structures 1002 should be used to help contain organic material 1022. Other variations may include formation of organic layer 1022 and only the second inorganic layer 1024 (as shown in FIG. 11E) and formation of organic layer 1022 along with only the first inorganic layer 1020 (as shown in FIG. 11F). The exemplary configurations of FIGS. 11A-11F are merely illustrative and do not serve to limit the scope of the present invention. If desired, other layers such as the TFT passivation layer 798 (FIG. 7A) may optionally be formed in conjunction with one or more encapsulation layers 1000 in the bent region to help shift the neutral stress plane.

The foregoing is merely illustrative and various modifications can be made by those skilled in the art without departing from the scope and spirit of the described embodiments. The foregoing embodiments may be implemented individually or in any combination.

What is claimed is:

1. A display having an active area and an inactive area surrounding the active area, comprising:
  a substrate;
  a conductive routing structure formed on the substrate in the inactive area of the display;
  encapsulation layers formed over the active area of the display, wherein the encapsulation layers comprise a first inorganic layer, a second inorganic layer, and an organic layer interposed between the first and second inorganic layers;
  a dam structure that contains the encapsulation layers within the display and that is formed directly over the conductive routing structure; and
  a passivation layer that protects the conductive routing structure and that is formed below the encapsulation layers, the passivation layer covers an outer lateral edge of the conductive routing structure.

2. The display of claim 1, further comprising:
  an anode layer formed over the passivation layer; and
  a cathode layer formed over the anode layer, wherein the anode and cathode layers form an organic light-emitting diode.

3. The display of claim 1, wherein the dam structure is formed away from the outer edge of the conductive routing structure.

4. The display of claim 1, further comprising:
  an anode layer formed over the substrate;
  a cathode layer formed over the substrate;
  a first conductive structure formed below the cathode layer in the inactive area;
  a second conductive structure formed directly above the first conductive structure;
  a first planarization layer formed between the first and second conductive structures;
  a via formed through the first planarization layer that shorts the first conductive structure to the second conductive structure; and
  a second planarization layer formed between the anode layer and the second conductive structure.

5. The display of claim 4, wherein the passivation layer is at least partially formed on the second conductive structure.

6. Display circuitry, comprising:
  a substrate;
  display pixels formed over the substrate in an active area, wherein the active area is surrounded by an inactive area;
  a first conductor formed on the substrate in the inactive area;
  a second conductor formed over the first conductor;
  a first planarization layer formed between the first and second conductors;
  a second planarization layer formed on the second conductor; and
  a pixel definition layer formed on the second planarization layer, wherein the first conductor is shorted to the second conductor;
  a third conductor formed on the substrate in the same layer as the first conductor; and
  an anode layer coupled to the third conductor.

7. The display circuitry of claim 6, wherein the first and second conductors carry a power supply voltage.

8. The display circuitry of claim 7, further comprising:
  a fourth conductor formed over the third conductor in the same layer as the second conductor, wherein the third conductor is shorted to the fourth conductor, and wherein the first and third conductors carry a different power supply voltage.

9. The display circuitry of claim 6, further comprising:
  a fourth conductor formed directly on the third conductor.

10. The display circuitry of claim 6, further comprising:
  encapsulation layers formed over the active area;
  a dam structure that contains the encapsulation layers within the active area and that is formed directly over the third conductor; and
  a passivation layer that is formed under the encapsulation layers and that protects the third conductor.

11. The display circuitry of claim 10, wherein the passivation layer covers both an outer facing edge of the third conductor and lateral edges of the third conductor.

12. The display circuitry of claim 10, wherein the encapsulation layers comprises a first inorganic layer, a second inorganic layer, and an organic polymer layer sandwiched between the first and second inorganic layers.

13. A display having an active area and an inactive area surrounding the active area, comprising:
- a substrate;
- a conductive routing structure formed on the substrate in the inactive area of the display;
- encapsulation layers formed over the active area of the display;
- a first dam structure that contains the encapsulation layers within the display and that is formed directly over the conductive routing structure;
- a second dam structure that covers an outer lateral edge of the conductive routing structure; and
- a third dam structure that helps contain the encapsulation layers within the display and that is physically interposed between the first and second dam structures.

14. The display of claim 13, further comprising:
a polarizer film formed over the substrate that completely covers the encapsulation layers.

15. The display of claim 13, further comprising:
a passivation layer that protects the conductive routing structure and that is formed below the encapsulation layers and below the first, second, and third dam structures.

* * * * *

UNITED STATES PATENT AND TRADEMARK OFFICE
CERTIFICATE OF CORRECTION

| | | |
|---|---|---|
| PATENT NO. | : 9,716,248 B2 | Page 1 of 1 |
| APPLICATION NO. | : 15/087783 | |
| DATED | : July 25, 2017 | |
| INVENTOR(S) | : Bhadrinarayana Lalgudi Visweswaran et al. | |

It is certified that error appears in the above-identified patent and that said Letters Patent is hereby corrected as shown below:

In the Specification

In the detailed description, Column 7, Line 47, "planarization layer 608" should read --planarization layer 606--.

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*